US006265740B1

(12) United States Patent
Kim

(10) Patent No.: US 6,265,740 B1
(45) Date of Patent: Jul. 24, 2001

(54) SEMICONDUCTOR DEVICE CAPACITOR USING A FILL LAYER AND A NODE ON AN INNER SURFACE OF AN OPENING

(75) Inventor: Jin-won Kim, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/427,173

(22) Filed: Oct. 25, 1999

(30) Foreign Application Priority Data

Mar. 30, 1999 (KR) ................................. 99-10929

(51) Int. Cl.$^7$ ................................. H01L 27/108
(52) U.S. Cl. ................... 257/296; 257/296; 257/297; 257/298; 257/300; 257/303; 257/305; 257/310; 257/311; 257/309; 361/303; 361/306.3; 361/311
(58) Field of Search ................... 257/296, 297, 257/298, 300, 303, 305, 310, 311, 309; 361/303, 306.3, 311

(56) References Cited

U.S. PATENT DOCUMENTS

| 5,392,189 | | 2/1995 | Fazan et al. | 361/305 |
| 5,619,393 | * | 4/1997 | Summerfelt et al. | 361/321.1 |
| 6,060,735 | * | 5/1999 | Izuha et al. | 257/295 |
| 6,136,660 | * | 10/2000 | Shen et al. | 438/386 |
| 6,162,744 | * | 12/2000 | Al-Shareef et al. | 438/785 |

OTHER PUBLICATIONS

Y. Kohyama, et al., A Fully Printable, Self–aligned and Planarized Stacked Capacitor DRAM Cell Technology for 1Gbit DRAM and Beyond; 1977 Symposium on VLSI Technology Digest of Technical Papers; 2 pages (pp. 17 and 18).

* cited by examiner

Primary Examiner—Nathan Flynn
Assistant Examiner—Brian D. MacDonald
(74) Attorney, Agent, or Firm—Skjerven Morrill Macpherson LLP; David W. Heid

(57) ABSTRACT

A capacitor of a semiconductor device includes a first insulating layer having a contact hole therethrough and a contact plug that is in the contact hole and electrically connected to a semiconductor substrate. Also, a diffusion barrier layer is on the contact plug and fills the contact hole, and a storage node is on the insulating layer in contact with the diffusion barrier layer. The storage node has a uniform outer surface morphology and a cavity therein. A second insulating layer is on the first insulating layer and separates the storage nodes from adjacent storage nodes, and a fill layer fills the cavities of the storage nodes. A dielectric layer having a large dielectric constant covers the second insulating layer, the fill layer, and the storage nodes, and a plate node is on the dielectric layer. The storage node has a smooth surface adjacent the dielectric layer, which decreases leakage current. The diffusion barrier layer is buried in the contact hole and avoids oxidation that would otherwise increase contact resistance.

10 Claims, 4 Drawing Sheets

SEMICONDUCTOR DEVICE CAPACITOR USING A FILL LAYER AND A NODE ON AN INNER SURFACE OF AN OPENING

BACKGROUND OF THE INVENTION

1. Field of the Invention

The present invention relates to semiconductor devices and method for manufacturing semiconductor devices, and more particularly, to a capacitor of a semiconductor device and a manufacturing method thereof.

2. Description of the Related Art

Capacitors of highly integrated memory semiconductor devices, such as a large capacity dynamic random access memory (DRAM) and a ferroelectric random access memory (FRAM), include dielectric layers made of materials such as PZT ($PbZrTiO_3$) and BST ($BaSrTiO_3$), which have a high dielectric constant. Electrodes in these capacitors are often made of a metal from the platinum group or an oxide of a platinum group metal. However, forming and dry etching of platinum group metals and the their oxides often present difficulties. Further, the metals and oxides are prone to react with semiconductor substrates or polysilicon plugs. Accordingly, a diffusion barrier layer is required between the conductive layer and semiconductor materials such as polysilicon.

FIG. 1 illustrates a semiconductor device including a conventional capacitor having a dielectric layer with high dielectric constant. Referring to FIG. 1, a first insulating layer 3 having a contact hole 2 is on a semiconductor substrate 1, and a polysilicon contact plug 5 and a tantalum (Ta) diffusion barrier layer 7 are in contact hole 2. An etch stop layer 9 and a third insulating layer 11 are sequentially formed on first dielectric layer 3 overlying semiconductor substrate 1 and patterned to expose diffusion barrier layer 7 and adjacent portions of first insulating layer 3.

A storage node 13 is on the inner wall of the opening in third insulating layer 11 and on the exposed portions of diffusion barrier layer 7 and first insulating layer 3. A BST dielectric layer 15 is on storage node 13, and a ruthenium (Ru) plate node 17 is on dielectric layer 15.

Diffusion barrier layer 7 suppresses reactions between storage node 13 and contact plug 5. However, in the conventional capacitor of FIG. 1, the storage node 13 is thin, and deposition of dielectric layer 11 or subsequent annealing can oxidize diffusion barrier layer 7 into a $Ta_2O_5$ insulating layer. Thus, the contact resistance between storage node 13 and substrate 1 increases. Further, the chemical mechanical deposition that forms ruthenium storage node 13 leaves an irregular surface morphology, resulting in regions of storage node 13 with concentrated electric fields when the capacitor is in use. These high electric field regions can increase leakage current of the capacitor.

SUMMARY OF THE INVENTION

An embodiment of the present invention provides a capacitor of a semiconductor device. The capacitor includes a first insulating layer having a contact hole that exposes a semiconductor substrate. A diffusion barrier layer is inside the contact hole, and a storage node overlies a portion of the insulating layer and electrically connects to the diffusion barrier layer. The storage node has a cavity opened upward. A second insulating layer overlying a portion of the first insulating layer is between the storage node and adjacent storage nodes, and a fill layer fills the cavity in the storage node. A dielectric layer overlies the second insulating layer, the third insulating layer and the storage node, and a plate node overlies the dielectric layer. The capacitor may further include a contact plug between the semiconductor substrate the diffusion barrier layer or the diffusion barrier layer can electrically contact the substrate without an intervening contact plug.

In an exemplary embodiment, the diffusion barrier layer is formed of a nitride of a refractory metal, such as TiN, TiAlN, or TiSiN. The second insulating layer is a SiN layer, an $Al_2O_3$ layer, or a SiON layer. The fill layer is $SiO_2$, SiN, $Ta_2O_5$, $TiO_2$, or $Al_2O_3$. The plate node and the storage node are formed of a platinum group metal such as Pt, Ru, or Ir. The dielectric layer is a layer having Perovskite structure, such as $(Ba, Sr)TiO_3$, $PbZrTiO_3$ or $(Pb, La)(Zr, Ti)O_3$, $Ta_2O_5$ layer, or an $Al_2O_3$ layer.

Another embodiment of the invention provides a method for manufacturing a capacitor of a semiconductor device. The method includes: forming a first insulating layer having a contact hole on a semiconductor substrate; forming a diffusion barrier layer in the contact hole, wherein the diffusion barrier layer electrically connects to the semiconductor substrate; forming a second insulating layer and a third insulating layer sequentially on the first insulating layer, wherein a hole is formed in the second insulating layer and third insulating layer to expose the diffusion barrier layer; forming a conductive layer on the semiconductor substrate such that the conductive layer covers the inner wall of the hole in the second insulating layer and third insulating layer; forming an insulating fill layer that fills the remainder of the hole containing the conductive layer; removing upper portions of the fill layer until the third insulating layer is exposed but a portion of the fill layer remains in the hole; removing the third insulating layer to expose the second insulating layer; forming a dielectric layer on the semiconductor substrate, wherein the dielectric layer covers remaining portions of the fill insulating layer, the second insulating layer, and the conductive layer; and forming a plate node on the dielectric layer.

Forming the conductive layer on the inner surface of a hole in the insulating layers provides the conductive layer with a smooth surface that is later covered by the dielectric layer. Additionally, the presence's of the second insulating layer between storage electrodes and filling the cavity in the conductive layer prevents diffusion of oxygen and oxidation of the diffusion barrier layer.

BRIEF DESCRIPTION OF THE DRAWINGS

The features and advantages of the present invention will become more apparent by describing in detail particular embodiments with reference to the attached drawings, in which.

Use of the same reference symbols in different figures indicates similar or identical items.

DESCRIPTION OF THE PREFERRED EMBODIMENTS

Figure 1:
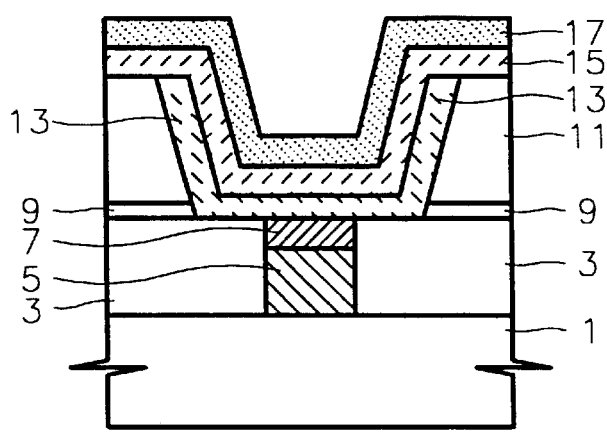
FIG. 1 is a sectional view of a semiconductor device including a conventional capacitor having a dielectric layer with a large dielectric constant.
Figure 2:
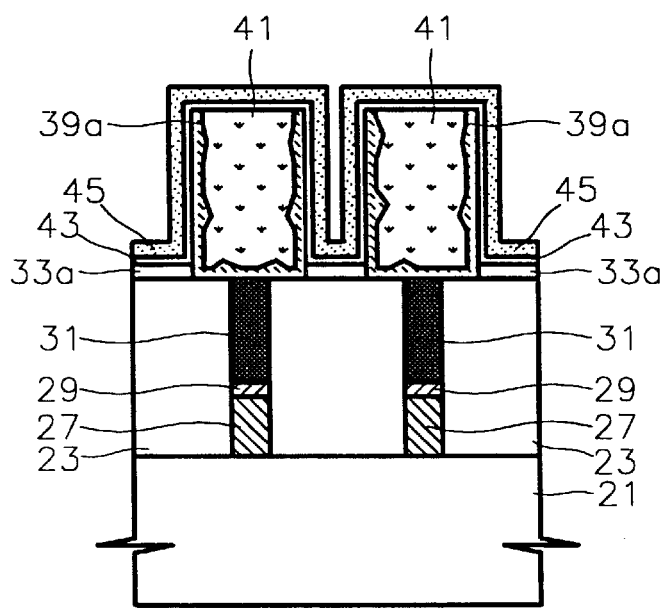
FIG. 2 is a sectional view of a semiconductor device illustrating a capacitor structure of the semiconductor device according to an embodiment of the present invention.

FIG. 2 illustrates a capacitor structure of a semiconductor device in accordance with an embodiment of the present invention. In FIG. 2, an insulating layer 23 having contact holes 25 is on a semiconductor substrate 21. In each contact hole 25, a contact plug 27, an ohmic layer 29 and a diffusion barrier layer 31 are sequentially formed. Contact plug 27 is polysilicon and electrically connects to substrate 21. Ohmic layer 29 is titanium silicide $TiSi_2$. Diffusion barrier layer 31, which prevents a storage node 39 from reacting with contact plug 27 can be a nitride of a refractory metal, e.g., TiN, TiAlN or TiSiN.

A storage node 39a in electrical contact with a corresponding diffusion barrier layer 31 has a uniform outer surface morphology and an inner cavity. Storage nodes 39a are on diffusion barrier layer 31 and insulating layer 23. Storage node 39a is formed of a metal from the platinum group, such as Pt, Ru or Ir, and has a thickness of 100 to 500 Å. A insulating fill layer 41, which includes $SiO_2$, SiN, $Ta_2O_5$, $TiO_2$, or $Al_2O_3$, fills the cavity in storage node 39a. Storage node 39a is on the outer wall of fill layer 41 and has a relatively smooth outer surface. The smooth outer surface decreases leakage current in the capacitor.

A second insulating layer 33a is on insulating layer 23 and between adjacent storage nodes 39a. Second insulating layer 33a prevents oxygen diffusion into insulating layer 23 during forming and annealing a dielectric layer 43. Second insulating layer 33a can be a patterned SiN, $Al_2O_3$, or SiON layer or a patterned composite layer including SiN, $Al_2O_3$, or SiON layers.

Dielectric layer 43 covers fill layer 41, second insulating layer 33a and storage node 39a. Dielectric layer 43 is typically a layer of a material having Perovskite structure such as $(Ba, Sr)TiO_3$, $PbZrTiO_3$, or $(Pb, La)(Zr, Ti)O_3$. Alternatively, a $Ta_2O_5$ layer, an $Al_2O_3$ layer, or a composite layer including a $Ta_2O_5$ layer or an $Al_2O_3$ layer can form dielectric layer 43. A plate node 45, which is a platinum group metal layer, e.g., a Pt, Ru or Ir layer, is on dielectric layer 43.

FIGS. 3 to 9 illustrate a method for manufacturing a capacitor of a semiconductor device according to an embodiment of the present invention.

Figure 3:
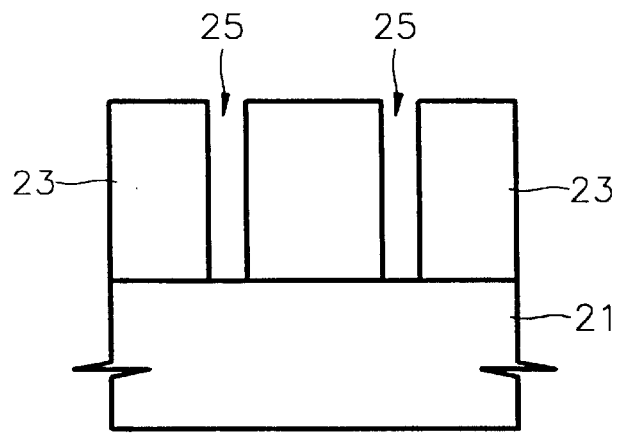
FIGS. 3 to 9 are sectional views of semiconductor structures illustrating a method for manufacturing a capacitor of a semiconductor device according to an embodiment of the present invention.

Referring to FIG. 3, chemical vapor deposition (CVD) forms a first insulating layer 23, which is an oxide layer or a BPSG (boro-phospho-silicate-glass) layer, on a substrate 21, e.g., a silicon substrate. Circuit elements such as transistors (not shown) are typically formed in and on substrate 21 prior to deposition of first insulating layer 23. Photolithography and etching processes selectively remove portions of first insulating layer 23 to form contact holes 25 for electrically connecting underlying circuit elements in and on substrate 21 to storage nodes 39a of capacitors to be formed.

Figure 4:
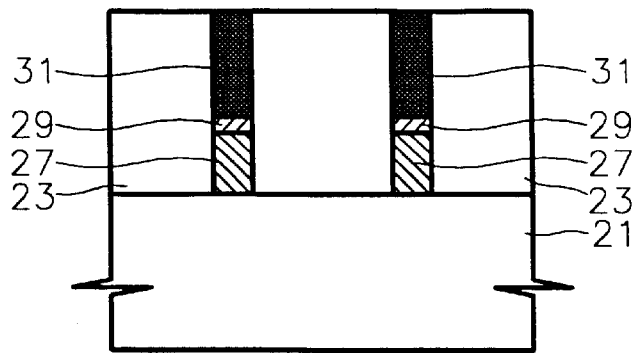

Referring to FIG. 4, a contact plug 27, electrically connected to semiconductor substrate 21, an ohmic layer 29, and a diffusion barrier layer 31 are sequentially formed in contact hole 25. In an exemplary embodiment, contact plug 27 is of polysilicon; ohmic layer 29 is titanium silicide ($TiSi_2$); and diffusion barrier layer 31 is TiN, TiAlN or TiSiN. Diffusion barrier layer 31 prevents subsequently formed storage node 39a from reacting with contact plug 27 or substrate 21. Diffusion barrier layer 31 can avoid oxidation because diffusion barrier layer 31 is buried in contact hole 25. In an alternative embodiment, contact plug 27 is absent, and diffusion barrier layer 31 in the contact hole 25 connects to semiconductor substrate 21.

Figure 5:
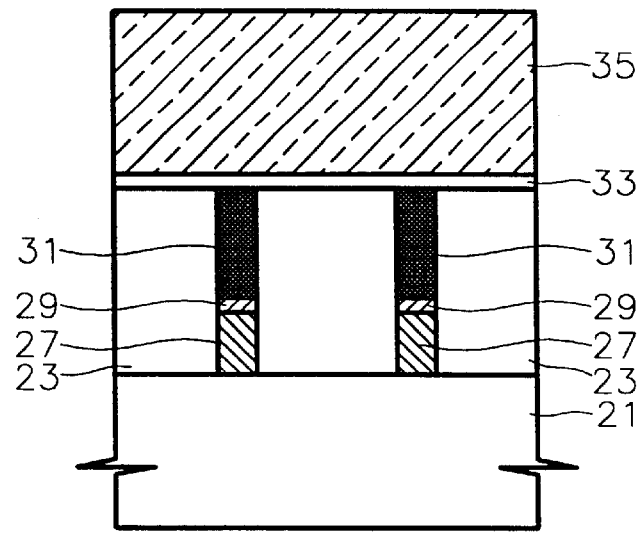

Referring to FIG. 5, a second insulating layer 33 is formed on diffusion barrier layer 31 and first insulating layer 23 to a thickness of 300 to 1,000 Å. Second insulating layer 33 is formed of SiN, $Al_2O_3$, SiON or a combination of SiN, $Al_2O_3$, and SiON. Subsequently, a third insulating layer 35, which is an oxide layer or a BPSG layer, is formed on second insulating layer 33.

Figure 6:
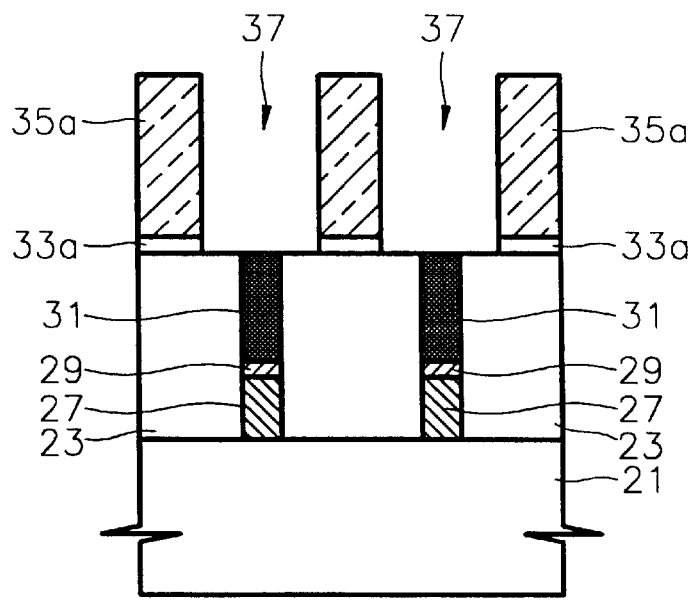

Referring to FIG. 6, photolithography and etching processes pattern third insulating layer 35 so as to expose portions of second insulating layer 33 above contact hole 25. Second insulating layer 33 acts as an etch stopping layer in etching third insulating layer 35. Subsequent patterning of second insulating layer 33 exposes diffusion barrier layer 31 and first insulating layer 23 adjacent to diffusion barrier layer 31. The patterning of third insulating layer 35 and second insulating layer 33 forms holes 37 and leaves patterned layers 35a and 33a.

Figure 7:
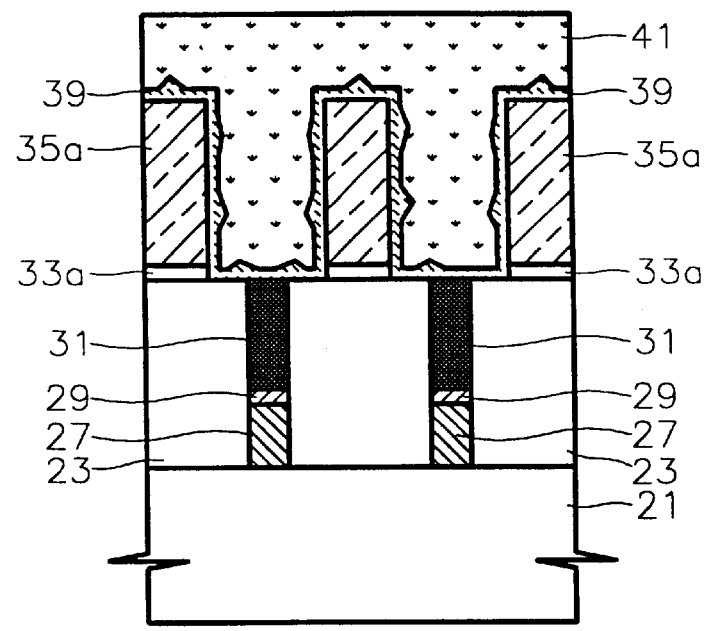

Referring to FIG. 7, chemical vapor deposition forms a 100 to 500-Å thick conductive layer 39, which will form storage nodes 39a of the capacitors. Accordingly, conductive layer 39 covers the inner surface of holes 37 and the top surface of third insulating layer 35a. Conductive layer 39 contains a platinum group metal, e.g., Pt, Ru, or Ir. Conductive layer 39 formed by CVD typically has nonuniform morphology on its top surface. instead of CVD, physical vapor deposition or electric plating can form conductive layer 39.

On conductive layer 39, chemical vapor deposition forms an insulating fill layer 41 that fills remainder of holes 37. Fill layer 41 contains a material having a high etching selectivity during removal of third insulating layer 35a. For example, fill layer 41 contains $SiO_2$, SiN, $Ta_2O_5$, $TiO_2$, $Al_2O_3$ or a combination thereof when third layer 35a is a BPSG layer, $O_3$ TEOS layer, silicon oxide layer, or another similar layer.

Figure 8:
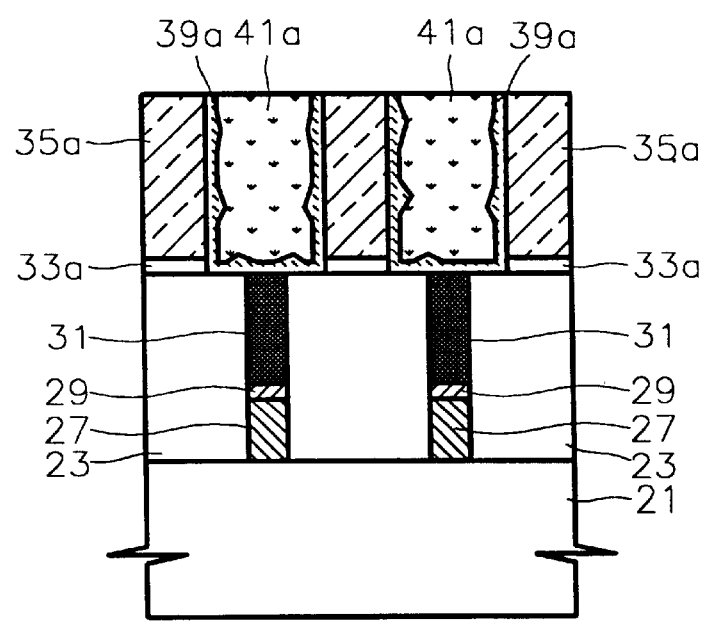

Referring to FIG. 8, chemical mechanical polishing or an etchback process removes upper portions of fill layer 41 and conductive layer 39 to separate areas or portions of patterned layer 35a, conductive layer 39a, and fill layer 41a. The portions of conductive layer 39 within holes 37 are storage nodes 39a of the capacitors Referring to FIG. 9, wet or dry etching removes third insulating layer 35a to separate adjacent storage nodes 39a but leaves layers 33a and 41a largely intact. Here, second insulating layer 33a and fill layer 41a have a high etching selectivity to the process that removes insulating layer 35a so that third insulating layer 35a can be removed without significantly damaging layers 33a and 41a. In this embodiment, the surfaces of storage nodes 39a, which were formed by filling holes 37, inherit the uniformity the inner walls of holes 37, and this uniformity decreases leakage current of the capacitors.

Figure 9:
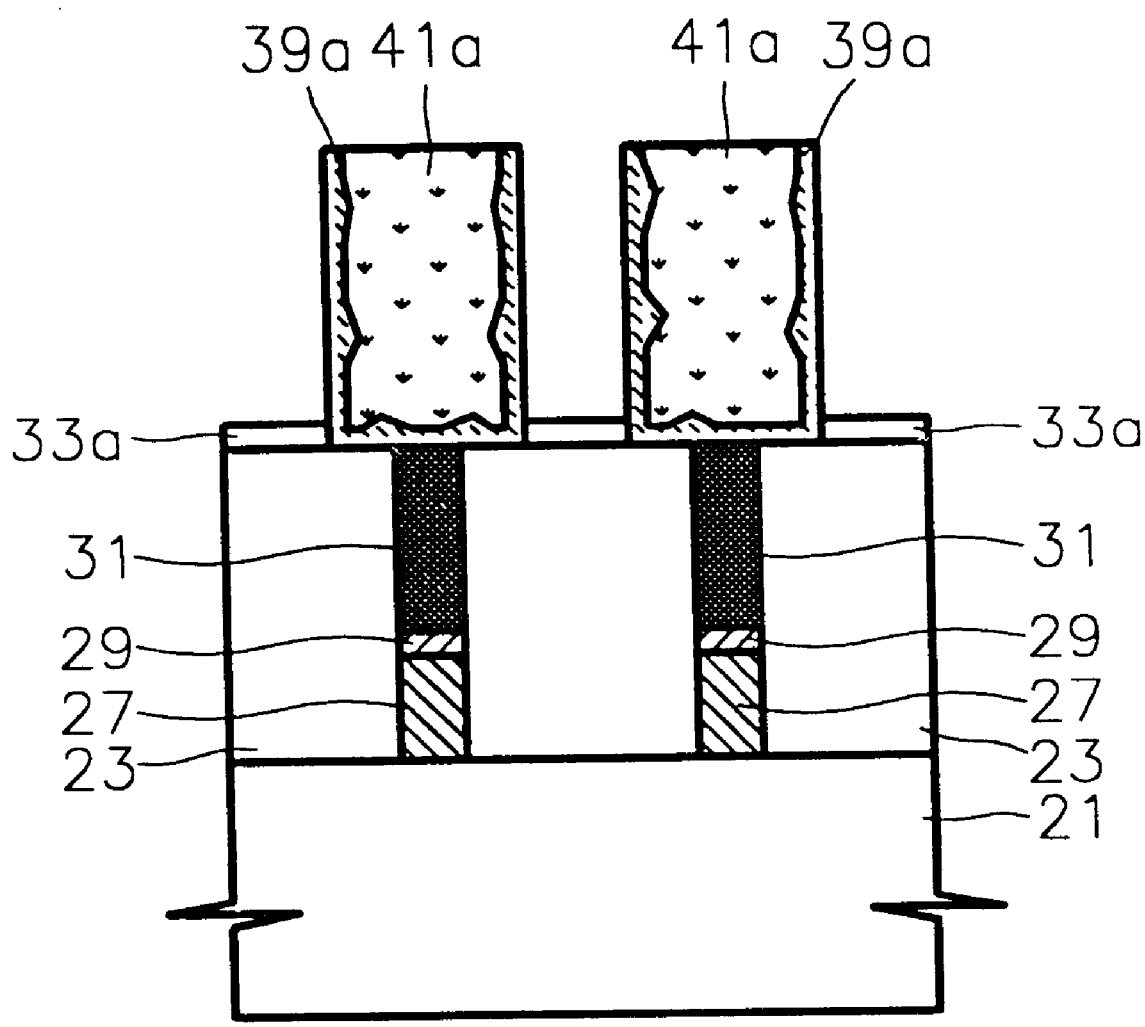

Finally, as shown in FIG. 2, dielectric layer 43 is formed to a thickness of 50 to 300 Å on the structure of FIG. 9, and annealing under an oxygen atmosphere or oxygen plasma atmosphere at a temperature of 300 to 700° C. enhances the characteristics of dielectric layer 43. Dielectric layer 43 contains: a material having Perovskite structure, such as $(Ba, Sr)TiO_3$, $PbZrTiO_3$ or $(Pb, La)(Zr, Ti)O_3$; $Ta_2O_5$; or $Al_2O_3$. During the annealing, second insulating layer 33a prevents diffusion of oxygen and thereby prevents oxidation of diffusion barrier layer 31. To complete a capacitor, a plate node 45, containing a Pt group metal, e.g., Pt, Ru or Ir, is formed on dielectric layer 43 to a thickness of 100 to 1,000 Å.

As described above, fill layer 41a and forming storage nodes 39a on the walls of holes 37 reduces the roughness of the surface in contact with dielectric layer 43 to thereby reduce the leakage currents in the capacitors. Also, using a structure where the diffusion barrier layer is buried prevents oxidation of diffusion barrier layer 31. Particularly, second insulating layer 33*a* on insulating layer 23 adjacent to diffusion barrier layer 31 prevents diffusion of oxygen during forming and annealing of dielectric layer 43 to thereby prevent oxidation of diffusion barrier layer 31. Thus, contact resistance remains low. Also, storage node 39*a* has a wide surface area and a thickness of 100 to 500 Å or less.

Although the invention has been described with reference to particular embodiments, the description is only an example of the inventor's application and should not be taken as a limitation. Various adaptations and combinations of features of the embodiments disclosed are within the scope of the invention as defined by the following claims.

What is claimed is:

1. A semiconductor device comprising:
    a first insulating layer overlying a semiconductor substrate, the first insulating layer having a contact hole;
    a diffusion barrier layer inside the contact hole;
    a platinum group metal storage node overlying a portion of the insulating layer so as to connect to the diffusion barrier layer, wherein the storage node includes a cavity that is open upward;
    a second insulating layer overlying a portion of the first insulating layer, the second insulating layer being patterned so that portions of the second insulating layer are between the storage node and an adjacent storage node;
    a fill layer filling the cavity of the storage node;
    a dielectric layer overlying the second insulating layer, the fill layer and the storage node; and
    a plate node overlying the dielectric layer.

2. The device of claim 1, wherein the diffusion barrier layer comprises a nitride of a refractory metal.

3. The device of claim 2, wherein the nitride is a material selected from a group consisting of TiN, TiAlN, and TiSiN.

4. The device of claim 1, wherein the second insulating layer comprises a material selected from a group consisting of SiN, $Al_2O_3$, SiON, and composites thereof.

5. The device of claim 1, wherein the fill layer comprises a material selected from a group consisting Of $SiO_2$, SIN, $Ta_2O_5$, $TiO_2$, $Al_2O_3$ and composites thereof.

6. The device of claim 1, wherein the plate node is formed of a platinum group metal.

7. The device of claim 6, wherein the platinum group metal is selected from a group consisting of Pt, Ru, and Ir.

8. The device of claim 1, wherein the dielectric layer comprises a material selected from a group consisting of materials having Perovskite structure, $Ta_2O_5$, $Al_2O_3$, and composites thereof.

9. The capacitor of claim 8, wherein the materials having Perovskite structure comprise $(Ba, Sr)TiO_3$, $PbZrTiO_3$, and $(Pb, La)(Zr, Ti)O_3$.

10. The capacitor of claim 1, further comprising a contact plug inside the contact hole, wherein the diffusion barrier layer overlies the contact plug.

* * * * *